United States Patent [19]
Imai

[11] Patent Number: 5,661,548
[45] Date of Patent: Aug. 26, 1997

[54] PROJECTION EXPOSURE METHOD AND APPARATUS INCLUDING A CHANGING SYSTEM FOR CHANGING THE REFERENCE IMAGE-FORMATION POSITION USED TO GENERATE A FOCUS SIGNAL

[75] Inventor: Yuji Imai, Saitama-ken, Japan

[73] Assignee: Nikon Corporation, Tokyo, Japan

[21] Appl. No.: 561,284

[22] Filed: Nov. 21, 1995

[30] Foreign Application Priority Data

Nov. 30, 1994 [JP] Japan ................... 6-296653

[51] Int. Cl.⁶ .................................. H01L 21/30
[52] U.S. Cl. .................. 355/55; 355/52; 250/201.2; 250/201.4; 250/548
[58] Field of Search .................... 355/50, 52, 53, 355/55, 77; 250/548, 201.2, 201.4; 396/111, 115, 116, 118, 120; H01L 21/30

[56] References Cited

U.S. PATENT DOCUMENTS

| | | | |
|---|---|---|---|
| 5,416,562 | 5/1995 | Ota et al. | 355/53 |
| 5,483,056 | 1/1996 | Imai | 250/201.4 |
| 5,581,324 | 12/1996 | Miyai et al. | 355/53 |

Primary Examiner—Arthur T. Grimley
Assistant Examiner—Herbert Kerner
Attorney, Agent, or Firm—Armstrong, Westerman, Hattori, McLeland & Naughton

[57] ABSTRACT

In a stage slit type focus position detecting system, an opening pattern unit (11A) on a reticle (10) is illuminated with exposure light (IL1) from a light source system (1), and light passing through the opening pattern unit (11A) is received through a projection optical system (13) and a reference pattern plate (23). In a stage emission type focus position detecting system, the reference pattern plate (23) is illuminated with illuminating light from a light source (35), and light passing through the reference pattern plate (23) and further going and returning through the projection optical system (13) is received by a photoelectric detector (42). An oblique incidence type AF sensor has a light-transmitting system (24) and a converging optical system (28). Thus, even if the projection optical system absorbs thermal energy of exposure light and thus causes the position of its image-formation plane to change, calibration of the oblique incidence type AF sensor can be readily made by using the stage slit type focus position detecting system and the stage emission type focus position detecting system.

20 Claims, 9 Drawing Sheets

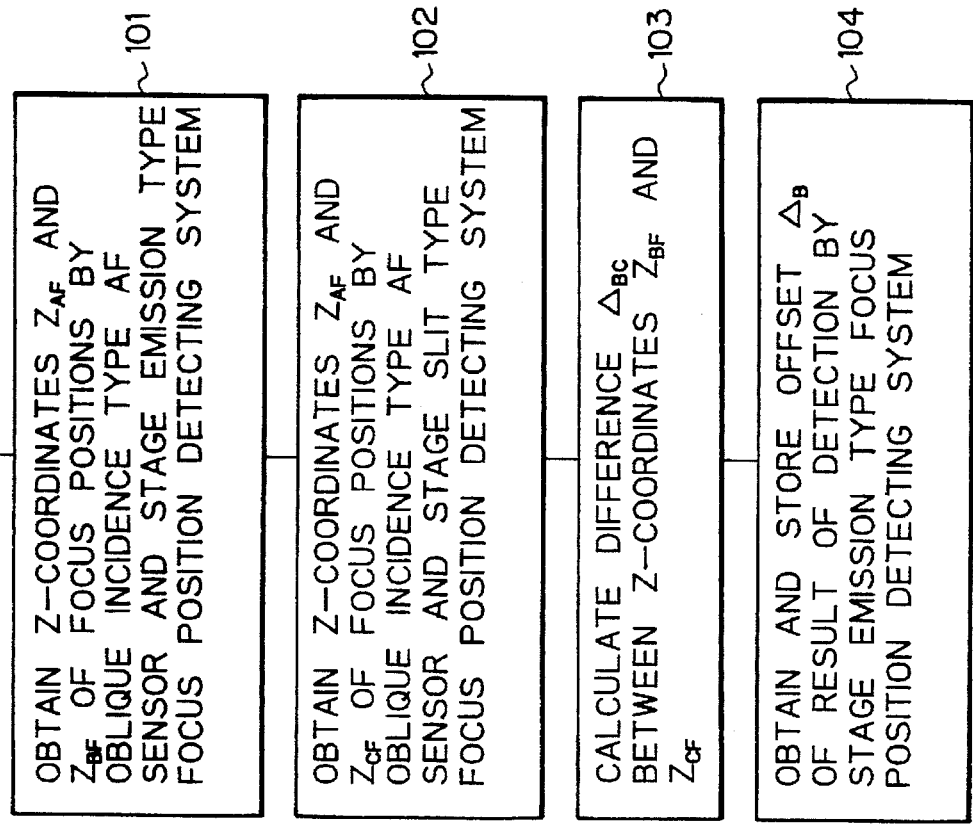

START

121 — OBTAIN Z-COORDINATES $Z_{BF}$ AND $Z_{CF}$ OF FOCUS POSITIONS BY STAGE EMISSION TYPE FOCUS POSITION DETECTING SYSTEM AND STAGE SLIT TYPE FOCUS POSITION DETECTING SYSTEM

122 — OBTAIN AND STORE OFFSET $\Delta_B$ OF RESULT OF DETECTION BY STAGE EMISSION TYPE FOCUS POSITION DETECTING SYSTEM

PROJECTION EXPOSURE METHOD AND APPARATUS INCLUDING A CHANGING SYSTEM FOR CHANGING THE REFERENCE IMAGE-FORMATION POSITION USED TO GENERATE A FOCUS SIGNAL

BACKGROUND OF THE INVENTION

1. Field of the Invention

The present invention relates to a projection exposure method and a projection exposure apparatus, which are usable for production, for example, of semiconductor devices, liquid crystal display devices, etc., and in which exposure is carried out by adjusting a photosensitive substrate adjusted so as to become coincident with the image-formation plane of a projection optical system by an auto-focusing method using a result of detection obtained by an oblique incidence type focus position detecting system (AF sensor). More particularly, the present invention relates to calibration of the oblique incidence type focus position detecting system.

2. Description of Background Art

In a projection exposure apparatus used to produce, for example, semiconductor integrated circuits, liquid crystal panels, etc., a photosensitive substrate must be adjusted so as to be exactly coincident with the image-formation plane of a projection optical system. Therefore, projection exposure apparatuses have heretofore been provided with an auto-focus mechanism for adjusting the photosensitive substrate to the image-formation plane of the projection optical system by controlling the height of the wafer stage on the basis of the position of the photosensitive substrate in the direction of the optical axis of the projection optical system, which is detected by using an oblique incidence type focus position detecting system (hereinafter referred to as "AF sensor").

The oblique incidence type AF sensor comprises a light-transmitting system for projecting a slit pattern or other image onto a predetermined measuring point on a workpiece, for example, a photosensitive substrate, obliquely to the optical axis of the projection optical system, and a light-receiving system which receives reflected light from the photosensitive substrate, re-forms the slit pattern or other image, and detects an amount of deviation of the position where the image is re-formed from a reference image-formation position. In this case, a position at which the slit pattern or other image is re-formed when the photosensitive substrate is coincident with the image-formation plane of the projection optical system (i.e. the reference image-formation position) has previously been obtained. Then, in actual process, the height (i.e. the position in a direction perpendicular to the image formation plane of said projection optical system) of the photosensitive substrate is adjusted so that the position where the slit pattern or other image is re-formed coincides with the reference image-formation position, thereby effecting auto-focusing for the photosensitive substrate.

As a device for directly measuring the position of the image-formation plane (i.e. focus position) of the projection optical system, a stage emission type focus position detecting system has heretofore been known. In this type of focus position detecting system, for example, an image of a predetermined reference pattern provided on a wafer stage is projected onto the lower surface (pattern surface) of a reticle as a mask through a projection optical system above the stage by means of light from an illumination system which is separate from an illumination system for exposure of the projection exposure apparatus. Then, reflected light from the reticle is returned toward the wafer stage through the projection optical system and received through the reference pattern. Thus, a position at which a detection signal, which is obtained as the wafer stage is vertically moved, assumes an extreme value is detected as the position of the image-formation plane.

There is also known a stage slit type focus position detecting system. In this type of focus position detecting system, for example, a reticle as a mask is illuminated by an illumination optical system of a projection exposure apparatus to project an image of a predetermined opening pattern unit for detection (having a plurality of slit-shaped transparent portions), which is specially provided on the reticle, onto a wafer stage through a projection optical system, and the image-forming light thus projected is received through an opening pattern for detection which is specially provided on the wafer stage. Thus, a position at which a detection signal, which is obtained as the wafer stage is vertically moved, assumes an extreme value is detected as the position of the image-formation plane.

As has been described above, the use of the oblique incidence type AF sensor makes it possible to accurately detect an amount of deviation of a measuring point on the photosensitive substrate from the detected position of the image-formation plane of the projection optical system. However, when exposure is continuously carried out, thermal energy of exposure light is accumulated in the projection optical system, causing the image-formation characteristics of the projection optical system to change. Accordingly, the detected position of the image-formation plane, which should essentially be fixed, may change. If the position of the image-formation plane changes in this way, the oblique incidence type AF sensor detects an amount of deviation of the measuring point on the photosensitive substrate from the image-formation plane (reference position) determined before the change of the position. Therefore, if auto-focusing is carried out by using a result of detection made by the oblique incidence type AF sensor, the photosensitive substrate cannot be adjusted so as to be coincident with the image-formation plane after the change of the position.

With the stage emission type focus position detecting system, even when the position of the image-formation plane of the projection optical system has changed because, for example, of thermal deformation of the projection optical system caused by absorption of thermal energy of exposure light, the position of the image-formation plane of the projection optical system can be accurately detected. However, the stage emission type focus position detecting system uses an illumination optical system which is independent of the illumination optical system for exposure of the projection exposure apparatus. Accordingly, the stage emission type focus position detecting system suffers from the problem that there may be a predetermined offset between the position of the image-formation plane of the projection optical system when the reticle is actually illuminated with exposure light from the illumination optical system for exposure of the projection exposure apparatus, and the focus position measured by the stage emission type focus position detecting system using light from the independent illumination optical system.

In regard to the illumination optical system for exposure, there are cases where a modified light source illumination method, an annular illumination method, etc. are selectively used, as disclosed, for example, in U.S. patent application Ser. No. 791,138, in order to increase resolution. If illumination optical systems are changed over from one to another as described above, the exposure light illuminance distribution on the pupil plane (Fourier transform plane) of the projection optical system changes, and the position of the image-formation plane of the projection optical system also changes, resulting in a change of the offset between the focus position measured by the stage emission type focus position detecting system and the position of the image-formation plane of the projection optical system when exposure light is actually applied.

The use of the stage slit type focus position detecting system makes it possible to detect the position of the image-formation plane of the projection optical system when exposure light is actually applied because this focus position detecting system uses the illumination optical system for exposure of the projection exposure apparatus. However, the stage slit type focus position detecting system has the problem that, since it is particularly necessary to use a special reticle formed with a predetermined opening pattern unit for detection, it is impossible to detect the position of the image-formation plane when a reticle for actual exposure is used. Even if the reticle used for actual exposure is provided with an opening pattern unit for detection, since the opening pattern unit can be provided in only a limited area other than the pattern area for exposure, it is difficult to measure the position of the image-formation plane at a desired measuring point in the exposure field of the projection optical system.

Further, neither of the stage emission and stage slit type focus position detecting systems can be used when the photosensitive substrate is set in the exposure field of the projection optical system because the reference (opening) pattern provided on the wafer stage is out of the exposure field at that time. Therefore, these focus position detecting systems cannot be used as AF sensors for auto-focusing.

SUMMARY OF THE INVENTION

An object of the present invention is to provide a projection exposure apparatus which enables a desired measuring point on a photosensitive substrate to be accurately adjusted so as to be coincident with the image-formation plane of a projection optical system by an auto-focusing method even when the position of the image-formation plane has changed because, for example, of absorption of thermal energy of exposure light.

Another object of the present invention is to provide a projection exposure apparatus which enables a desired measuring point on a photosensitive substrate to be accurately adjusted so as to be coincident with the image-formation plane of a projection optical system by an auto-focusing method even when illumination optical systems have been changed over from one to another as described above.

To attain the above-described objects, the present invention provides a projection exposure apparatus including, as shown for example in FIGS. 1 to 3(b): an illumination optical system (1, 2, 5 to 9) for illuminating a mask (10); a projection optical system (13) for projecting an image of a pattern formed on the mask (19) onto a photosensitive substrate (14) under exposure light from the illumination optical system; a substrate stage (15 and 16) which is movable in a plane perpendicular to an optical axis of the projection optical system (13) with the photosensitive substrate (14) placed thereon, and which is also capable of moving the photosensitive substrate (14) in the optical axis direction; an oblique incidence type focus position detecting system (24, 28, 31 and 32) having a light-transmitting system (24) for projecting a pattern image for focus detection onto the photosensitive substrate (14) within an exposure field of the projection optical system (13) obliquely to the optical axis of the projection optical system (13), and a light-receiving system (28, 31 and 32) which receives reflected light from the photo-sensitive substrate (14), re-forms the pattern image for focus detection, and generates a focus signal corresponding to an amount of deviation of a position where the pattern image is re-formed from a predetermined reference image-formation position, so that the position of the substrate in the optical axis direction is adjusted on the basis of the focus signal; an independent illumination type focus position detecting system (e.g. a stage emission type focus position detecting system) having a light-transmitting system (35 to 40) for projecting an image of a predetermined measuring pattern (58) onto the mask (10) with independent illuminating light in the same wavelength region as the exposure light, and a light-receiving system (37 to 40, 41 and 42) which receives light from the predetermined measuring pattern image through the projection optical system (13) and an opening pattern (58) provided on the substrate stage (15 and 16), and which generates a first focus detecting signal (S1) corresponding to the quantity of light received; a stage slit type focus position detecting system which receives exposure light emanating from a pre-determined pattern (56) on the mask (10) illuminated by the illumination optical system (1, 2, 5 to 9) through the projection optical system (13) and an opening pattern (58) provided on the substrate stage (15 and 16), and which generates a second focus detecting signal (S2) corresponding to the quantity of light received; and a changing system (33) for changing the reference image-formation position used to generate a focus signal in the oblique incidence type focus position detecting system, on the basis of a first focus position $Z_{BF}$ of the projection optical system (13) which is obtained by the independent illumination type focus position detecting system and a second focus position $Z_{CF}$ of the projection optical system (13) which is obtained by the stage slit type focus position detecting system.

In this case, it is preferable that the light-receiving system (37 to 40, 41 and 42) should be common to the independent illumination type focus position detecting system and the stage slit type focus position detecting system.

An example of the light-transmitting system (35 to 40) of the independent illumination type focus position detecting system is arranged to illuminate the opening pattern (58) on the substrate stage (15 and 16) toward the projection optical system (13). In this case, the light-receiving system (37 to 40, 41 and 42) of the independent illumination type focus position detecting system receives illuminating light that goes and returns through the projection optical system (13).

It is preferable for the projection exposure apparatus to have a first memory (34a) for storing a difference $\Delta_{BC}$ between the first focus position $Z_{3F}$ obtained by the independent illumination type focus position detecting system at at least one point in the exposure field of the projection optical system (13) and the second focus position $Z_{CF}$ obtained by the stage slit type focus position detecting system at the at least one point, and an arithmetic unit (33) for obtaining a reference image-formation position used to generate a focus signal in the oblique incidence type focus position detecting system by using the first focus position $Z_{BF}$ obtained by the independent illumination type focus position detecting system and the difference $\Delta_{BC}$ stored in the first memory (34a).

The oblique incidence type focus position detecting system may be a multipoint focus position detecting system in which, as shown for example in FIG. 5, pattern images for focus detection are projected on a plurality of measuring points (63A to 63E), respectively, in the exposure field of the projection optical system (13), and the focus position of the projection optical system (13) at each of the measuring points is detected. In such a case, the projection exposure apparatus may be further provided with a second memory (34b) for storing a difference $\Delta_{AB}$ between the first focus position $Z_{BF}$ obtained by the independent illumination type focus position detecting system at at least one of the measuring points and a focus position $Z_{AF}$ obtained by the oblique incidence type focus position detecting system at at least one of the measuring points, so that the arithmetic unit (33) obtains a reference image-formation position used to generate a focus signal in the oblique incidence type focus position detecting system, by using the differences stored in the first and second memories (34a and 34b).

According to the projection exposure apparatus of the present invention, arranged as described above, a second focus position $Z_{CF}$ is obtained by the stage slit type focus position detecting system in a state where a mask formed with a predetermined pattern is placed in position. That is, a focus position under the application of exposure light from the illumination optical system for exposure of the projection exposure apparatus is obtained. Thereafter, a first focus position $Z_{BF}$ of the projection optical system (13) is obtained by the independent illumination type focus position detecting system. Then, a difference $\Delta_{BC}$ ($=Z_{CF}-Z_{BF}$) between the second focus position $Z_{CF}$ and the first focus position $Z_{BF}$ is obtained, and the difference $\Delta_{BC}$ is stored as an offset of the independent illumination type focus position detecting system.

Next, exposure is continuously carried out. If thermal deformation or other effect caused by absorption of thermal energy of exposure light appears in the projection optical system (13) during the exposure process, a first focus position $Z_{BF}'$ is obtained again by using the independent illumination type focus position detecting system, and at the same time, a focus position $Z_{AF}'$ is obtained by using the oblique incidence type focus position detecting system. Then, a difference $\Delta_{AC}'$ ($=\Delta A'$)($=Z_{BF}'+\Delta_{BC}-Z_{AF}'$) between the focus position $Z_{AF}'$ and a value ($Z_{BF}'+\Delta_{BC}$) obtained by correcting the focus position $Z_{BF}'$ for the offset is obtained. Thereafter, the position where the focus detection pattern image is re-formed is shifted (i.e. the reference position for image re-formation is shifted) by an amount corresponding to the difference $\Delta_{AC}'$ by changing the angle of a plane-parallel plate (43), for example, in the oblique incidence type focus position detecting system. Thus, focusing can be accurately effected even when the position of the image-formation plane changes because, for example, of absorption of thermal energy of exposure light. The reason for this is that, although absorption of thermal energy of exposure light causes deviation of the focus positions detected by the stage slit type focus position detecting system and the independent illumination type focus position detecting system, there is substantially no change in the offset $\Delta_{BC}$, which is the difference between the two focus positions $Z_{CF}$ and $Z_{BF}$.

In a case where the illumination optical system is changed, for example, from normal illumination to a modified light source illumination method, the focus position is remeasured by using the stage slit type focus position detecting system, thereby enabling the oblique incidence type focus position detecting system to be accurately calibrated.

To detect the focus position at a specific position in the exposure field of the projection optical system by the stage slit type focus position detecting system, it is necessary to use a special mask having a measuring pattern at a specific position, and hence difficult to detect the focus position at such a specific position. In this regard, the independent illumination type focus position detecting system can detect the focus position over a wide area of the exposure field with relative ease by controlling the position of the opening pattern (58) (i.e. by moving the stage) which is provided on not a mask but a reference pattern plate, for example. Therefore, the second focus position $Z_{CF}$ and the first focus position $Z_{BF}$ are respectively obtained by the stage slit type focus position detecting system and the independent illumination type focus position detecting system at a measuring point for the stage slit type focus position detecting system, and the difference $\Delta_{BC}$ between the first and second focus positions is stored in the first memory (34a). Considering the difference $\Delta_{BC}$ to be constant in the whole area of the exposure field, for a measuring point other than the above-mentioned point, the focus position $Z_{AF}$ detected by the oblique incidence type focus position detecting system is corrected ($\Delta_A=Z_{BF}'+\Delta_{BC}-Z_{AF}$) by the arithmetic unit (33) using the focus position $Z_{BF}'$ detected by the independent illumination type focus position detecting system and the difference $\Delta_{BC}$. Thus, the focus position under the application of exposure light can be approximately obtained at each measuring point in the whole area of the exposure field.

Further, when the oblique incidence type focus position detecting system is a multipoint AF sensor which is designed to detect the focus position at a plurality of measuring points in the exposure field, the focus position is detected by the independent illumination type focus position detecting system and the oblique incidence type focus position detecting system, for example, at one measuring point in the plurality of measuring points, and a difference $\Delta_{AB}$ between the focus positions $Z_{BF}$ and $Z_{AF}$ respectively detected by the two focus position detecting systems is obtained and stored in the second memory (34b). Considering that the difference between the focus positions respectively detected by the independent illumination type focus position detecting system and the oblique incidence type focus position detecting system is constant throughout the exposure field, for focus position detection at other measuring points, the result of detection by the oblique incidence type focus position detecting system is corrected on the basis of the differences stored in the first and second memories (34a and 34b), thereby enabling the focus position to be obtained fairly accurately at the plurality of measuring points.

DESCRIPTION OF THE PREFERRED EMBODIMENTS

One embodiment of the projection exposure apparatus according to the present invention will be described below with reference to the accompanying drawings.

Figure 1:
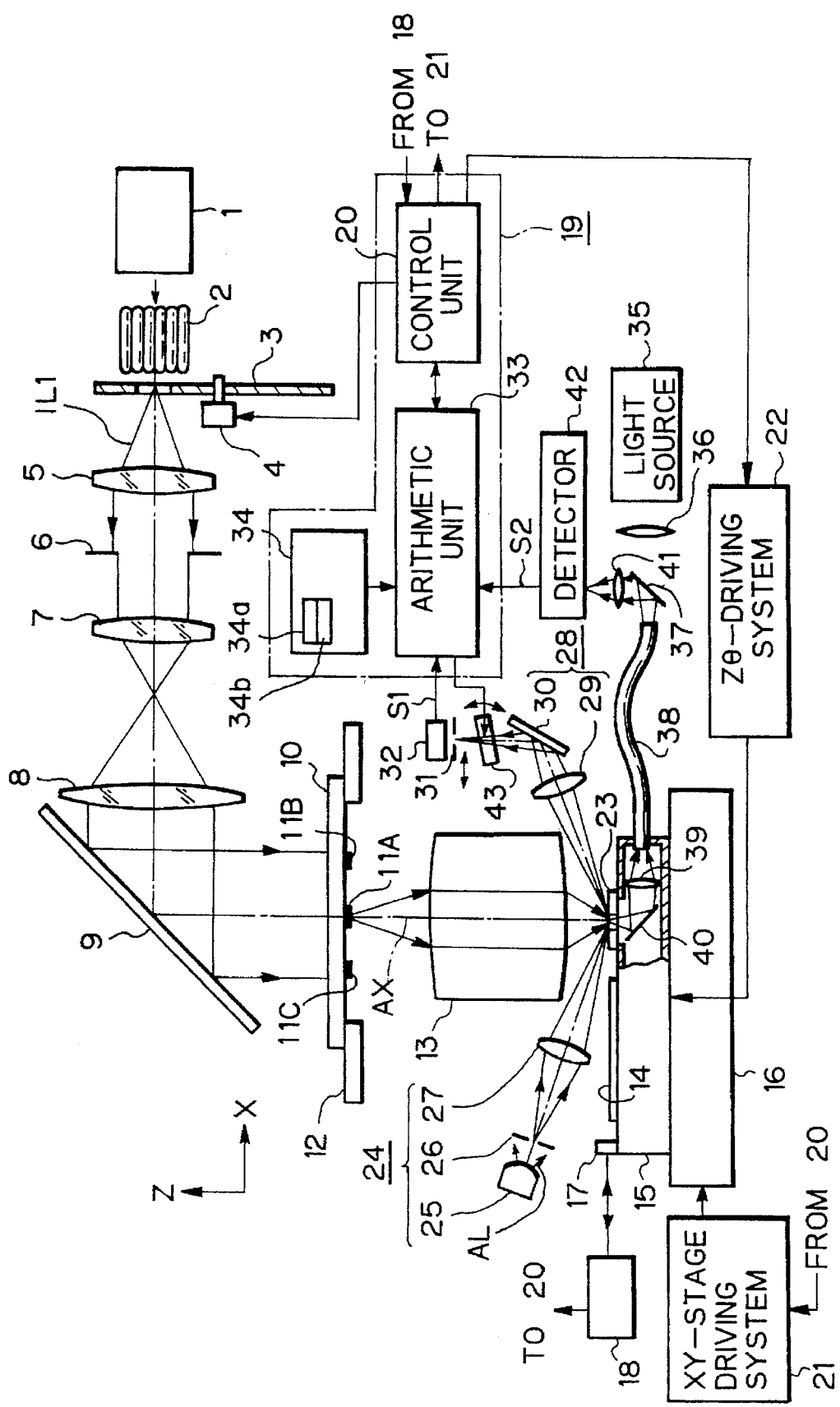
FIG. 1 is a block diagram partly containing a sectional view, showing one embodiment of the projection exposure apparatus according to the present invention.
Figure 2:
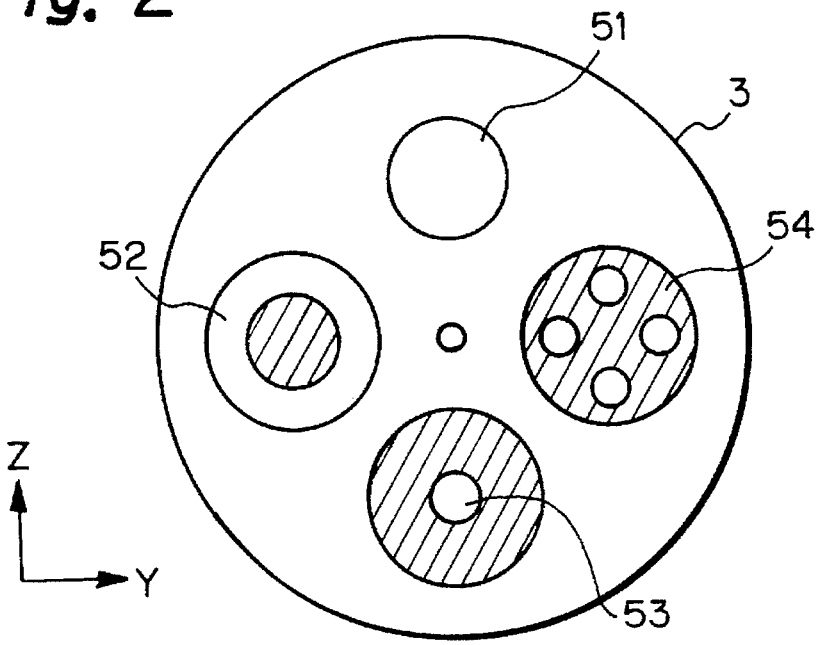
FIG. 2 is a front view showing the layout of aperture stops on a rotary plate in FIG. 1.

FIG. 1 shows the arrangement of the projection exposure apparatus according to the present invention. Referring to FIG. 1, a light source system 1 comprises a mercury-vapor lamp as a light source for exposure, an elliptic mirror, a collimator lens, an interference filter, etc. Exposure light emitted from the light source system 1 enters a fly-eye lens 2. A rotary plate 3 is disposed in the exit plane of the fly-eye lens 2. The rotary plate 3 is rotated by a drive motor 4. As shown in FIG. 2, the rotary plate 3 has four different stops which are circumferentially spaced at about 90°: a circular aperture stop 51 for normal illumination; an annular aperture stop 52 for annular illumination; a small circular aperture stop 53; and a modified light source aperture stop 54 having four decentered circular apertures.

Referring to FIG. 1, a main control system 19 generally controls the entire apparatus according to the minimum line width of a reticle as an object of exposure in this embodiment. The main control system 19 includes a control unit 20 which drives the motor 4 to set the most suitable aperture stop of the rotary plate 3 in the exit plane of the fly-eye lens 2. Exposure light IL1 passing through the aperture stop set in the exit plane passes through a first relay lens 5, a variable field stop (reticle blind) 6, a second relay lens 7 and a condenser lens 8 and is then reflected by an optical path bending mirror 9 to illuminate a reticle 10 with a uniform illuminance distribution. The reticle 10 used in this case is a test reticle which is employed when the focus position is detected by a stage slit type focus position detecting system (described later). In actual exposure process, the reticle 10 is replaced by a reticle for exposure which is formed with a circuit pattern, and under the application of exposure light IL1, an image of the circuit pattern is projected onto each shot region on a wafer 14 through a projection optical system 13. In FIG. 1, however, the wafer 14 is not set in the exposure position for the sake of description.

It should be noted that, as light IL1 for exposure, it is possible to use laser light, e.g. excimer laser (KrF excimer laser, ArF excimer laser, etc.), or metal vapor laser or YAG laser harmonic, in addition to emission lines from a mercury-vapor lamp or other light source. Further, a Z-axis is taken in a direction parallel to an optical axis AX of the projection optical system 13, and an X-axis is taken in a direction parallel to the plane of FIG. 1 within a plane perpendicular to the Z-axis. A Y-axis is taken in a direction perpendicular to the plane of FIG. 1.

Figure 3A:
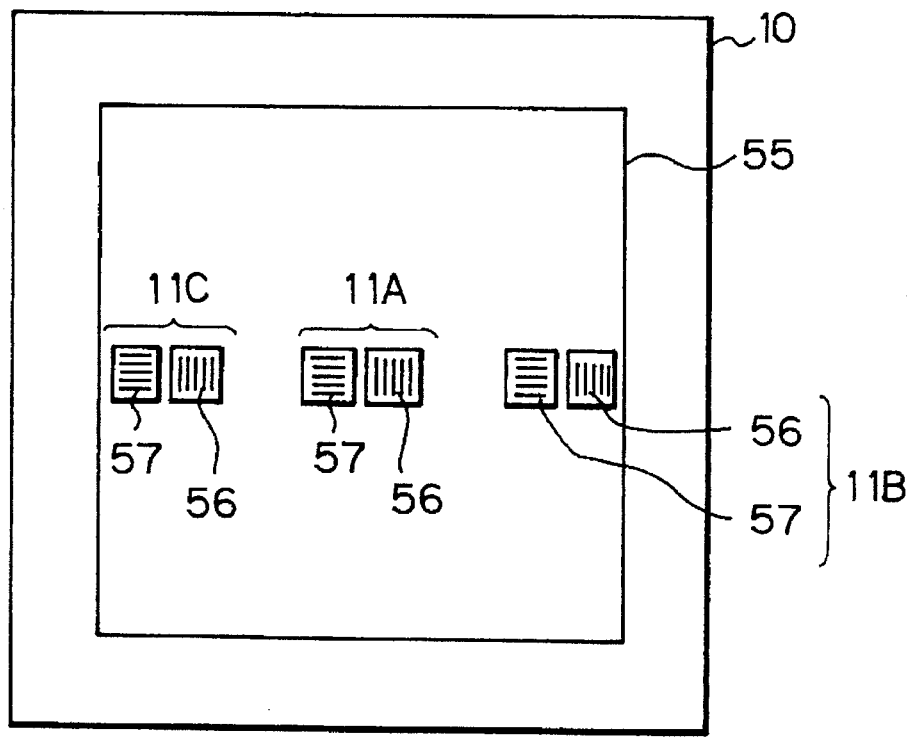
FIG. 3(a) is a fragmentary plan view showing one example of opening patterns provided on a reticle.

The reticle 10 is held by vacuum on a reticle stage 12 which is two-dimensionally movable and slightly rotatable in a plane (XY-plane) perpendicular to the optical axis AX. The position of the reticle stage 12 is always detected at a resolution of about 0.01 μm, for example, by a laser interferometer (not shown) which is disposed at the periphery of the reticle stage 12, and the result of the detection is supplied to the control unit 20. As shown in FIG. 3(a), the reticle 10 is formed with opening pattern units 11A, 11B and 11C.

FIG. 3(a) is an enlarged view of the reticle 10 in this embodiment. Referring to FIG. 3(a), the reticle 10 has a pattern area 55, and the opening pattern unit 11B is formed in an end portion within the pattern area 55 of the reticle 10. The opening pattern unit 11B comprises an opening pattern 56 having a plurality of slit-shaped transparent portions formed in a light-blocking film at a predetermined pitch in the direction X, and an opening pattern 57 having a plurality of slit-shaped transparent portions formed in the light-blocking film at a pre-determined pitch in the direction Y. It should be noted that the opening pattern units 11A and 11C also have opening patterns which are similar in configuration to the opening patterns 56 and 57 of the opening pattern unit 11B. The opening pattern units 11A, 11B and 11C are used when the focus position of the projection optical system 13 is to be detected by a stage slit type focus position detecting system (described later).

Figure 3B:
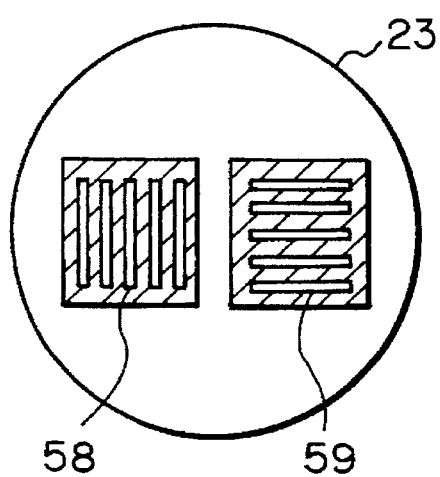
FIG. 3(b) is an enlarged plan view showing one example of reference opening patterns provided on a reference pattern plate (23).

Referring to FIG. 1, the wafer 14 is held by vacuum on a Z-stage 15. The Z-stage 15 is mounted on an XY-stage 16. Further, a reference pattern plate 23 is fixed to the surface of the Z-stage 15 in the vicinity of the wafer 14. The reference pattern plate 23 is a transparent glass substrate having a light-blocking film provided thereon. As shown in FIG. 3(b), the reference pattern plate 23 is formed with a reference opening pattern 58 having a plurality of slit-shaped transparent portions which are disposed in the light-blocking film at a predetermined pitch in the direction X, and a reference opening pattern 59 having a plurality of slit-shaped transparent portions which are disposed in the light-blocking film at a predetermined pitch in the direction Y. The reference opening patterns 58 and 59 have the same configurations and the same sizes as those of conjugate images of the opening patterns 56 and 57, which are provided on the reticle 10, as shown in FIG. 3(a).

Referring to FIG. 1, the Z-stage 15 is used to adjust the positions of the wafer 14 and the reference pattern plate 23 in the direction (Z) of the optical axis AX of the projection optical system 13. The Z-stage 15 in this embodiment further includes a leveling stage for controlling the inclination angle of the wafer 14 and the reference pattern plate 23. In addition, the Z-stage 15 is provided with a displacement sensor for accurately detecting an amount of displacement of the Z-stage 15 in the direction Z. The result of detection by the displacement sensor is supplied to the control unit 20 in the main control system 19. The displacement sensor is used to measure an amount of deviation between focus positions detected by a plurality of different types of focus position detecting system. Therefore, the detection of displacement by the displacement sensor requires high resolution (e.g. 0.01 μm). However, since the displacement detection needs to be carried out only in a considerably narrow range (e.g. within 1 mm), a potentiometer, for example, is usable as a displacement sensor. A laser interferometer is also usable. However, the displacement of the Z-stage 15 in the direction Z can also be detected by an oblique incidence type AF sensor (focus position detecting system), which will be described later.

The XY-stage 16 is used to position the wafer 14 and the reference pattern plate 23 in the directions X and Y. Upon completion of exposure for a certain shot region on the wafer 14, a shot region which is to be exposed subsequently is positioned in the exposure field by a stepping operation of the XY-stage 16. Thereafter, the surface of the wafer 14 is adjusted so as to be coincident with the image-formation plane of the projection optical system 13 by an auto-focusing method using the Z-stage 15. In this state, exposure is carried out.

Further, a moving mirror 17 for the X-axis is fixed to the surface of the Z-stage 15. A laser beam emitted from an external laser interferometer 18 is reflected by the moving mirror 17, and the reflected laser beam is received by the laser interferometer 18, thereby measuring the X-coordinate of the Z-stage 15. Similarly, the Y-coordinate of the Z-stage 15 is measured by a combination of a moving mirror and laser interferometer for the Y-axis (which are not shown in the figure). The coordinates measured in this way are supplied to the control unit 20. The control unit 20 controls the operation of the XY-stage 16 through an XY-stage driving system 21 on the basis of the supplied coordinates. Further, the control unit 20 controls the operation of the Z-stage 15 and the operation of the leveling stage, which is included in the Z-stage 15, through a Zθ driving system 22.

Next, the oblique incidence type AF sensor (focus position detecting system) in this embodiment will be explained. The oblique incidence type AF sensor comprises a light-transmitting system 24 and a converging optical system 28 which are disposed at both sides of the projection optical system 13. In the light-transmitting system 24, illuminating light AL emitted from a light source 25, e.g. a halogen lamp or a light-emitting diode, illuminates a slit plate 26. Illuminating light AL passing through a slit provided in the slit plate 26 is passed through an objective lens 27 to converge on a measuring point in the exposure field of the projection optical system 13 obliquely to the optical axis AX of the projection optical system 13, thereby projecting a slit image onto the measuring point. In the example shown in FIG. 1, the measuring point is set on the reference pattern plate 23. As illuminating light AL, light which is in a wavelength band in which a photoresist provided on the wafer 14 is only slightly affected, and which has a predetermined wavelength width is used for the purpose of reducing the effect of thin-film interference.

Reflected light from the measuring point enters the converging optical system 28 in which it is converged through a converging lens 29 and reflected by a mirror 30. Thereafter, the reflected light passes through a plane-parallel plate 43 and further through a vibrating slit plate 31 and enters a photoreceiver 32. A slit image is re-formed on the vibrating slit plate 31. The photoreceiver 32 comprises a light-receiving element and a synchronous rectifier circuit which synchronously rectifies a photo-electrically converted signal from the light-receiving element by a drive signal for the vibrating slit plate 31. Displacement of the reference pattern plate 23 in the direction Z causes a lateral displacement of the slit image on the vibrating slit plate 31 from the reference image-formation position. Therefore, a signal (hereinafter be referred to as "focus signal") S1 outputted from the photoreceiver 32 changes substantially linearly in a pre-determined range with respect to the position in the direction Z of the surface of the reference pattern plate 23 (or the wafer 14). The focus signal S1 is supplied to an arithmetic unit 33 in the main control system 19.

When the center of vibration of the vibrating slit plate 31 and the center of the slit image reflected from the reference pattern plate 23 and re-formed on the vibrating slit plate 31 are coincident with each other, the focus signal S1 is zero. Therefore, in this embodiment, the system is previously adjusted so that the focus signal S1 is zero when the position in the direction Z of a measuring point on the surface of the reference pattern plate 23 (or the wafer 14) is coincident with the position of the image-formation plane of the projection optical system 13 (i.e. the focus position). Accordingly, the position in the direction Z of the reference pattern plate 23 (or the wafer 14) when the value of the focus signal S1 is zero is the focus position detected by the oblique incidence type AF sensor. Change of the rotational angle of the plane-parallel plate 43 causes a lateral displacement of the position of the re-formed slit image. Therefore, the rotational angle of the plane-parallel plate 43 should be set so that the focus signal S1 is zero in a state where the surface of the reference pattern plate 23, for example, is made coincident with the image-formation plane obtained in advance.

However, since the position of the image-formation plane is variable, the relationship between the amount of change of the rotational angle of the plane-parallel plate 43 and the corresponding amount of change of the position in the direction Z of the reference pattern plate 23 (or the wafer 14) has previously been obtained and stored in a memory unit 34. When there is a change in the position of the image-formation plane, the arithmetic unit 33 effects follow-up control of the rotational angle of the plane-parallel plate 43 according to the position of the image-formation plane, as described later. Thus, when the position in the direction Z of the wafer 14, for example, coincides with the position of the image-formation plane after the change, the focus signal S1 becomes zero. In this embodiment, a system that comprises the converging optical system 28, the plane-parallel plate 43, the vibrating slit plate 31 and the photoreceiver 32 is referred to as "a light-receiving system of the oblique incidence type AF sensor". It should be noted that it is also possible to use a one-dimensional image sensor, for example, for detecting the position of the re-formed slit image.

Next, the stage slit type focus position detecting system in this embodiment will be explained. The stage slit type focus position detecting system uses the exposure illumination optical system of the projection exposure apparatus as a light-transmitting system. In this embodiment, the stage slit type focus position detecting system uses the opening pattern unit 11A of the reticle 10. Referring to FIG. 1, exposure light IL1 emitted from the illumination optical system, which comprises the light source system 1, the condenser lens 8, those members which are disposed therebetween, and the mirror 9, illuminates the opening pattern unit 11A of the reticle 10. Exposure light IL1 passing through the opening pattern unit 11A forms an image of the opening pattern unit 11A over the reference opening patterns 58 and 59 (see FIG. 3(b)) on the reference pattern plate 23 through the projection optical system 13. Exposure light IL1 passing through the reference opening patterns 58 and 59 enters the inside of the Z-stage 15 in which it is reflected by a mirror 40 and passed through a converging lens 39 to converge on one end of a light guide 38. The other end of the light guide 38 is installed outside the Z-stage 15. Exposure light IL1 emitted from the other end of the light guide 38 travels via a beam splitter 37 and a converging lens 41 and enters a photoelectric detector 42 in which it is photoelectrically converted into a detection signal S2. The detection signal S2 is supplied to the arithmetic unit 33 in the main control system 19. Accordingly, the members which are disposed in order from the mirror 40 to the photoelectric detector 42 constitute a light-receiving system of the stage slit type focus position detecting system.

It should be noted that the reference pattern plate 23 is positioned in the XY-plane through the XY-stage 16 so that the reference opening patterns 58 and 59, shown in FIG. 3(b), are coincident with respective positions where conjugate images of the opening patterns 56 and 57 of the opening pattern unit 11A are projected. Further, the bottom of the reference pattern plate 23 is provided with a shutter mechanism which covers either one of the reference opening patterns 58 and 59, so that only exposure light IL1 passing through either one of the reference opening patterns 58 and 59 is led to the photoelectric detector 42.

When the focus position is to be obtained, the reference pattern plate 23 is moved in the direction Z by the Z-stage 15 while exposure light IL1 passing through the reference opening pattern 58 or 59 is being received with the photoelectric detector 42. Assuming that the amount of displacement in the direction Z is monitored by using the oblique incidence type AF sensor, the slit image is projected onto the reference opening pattern 58 or 59 from the oblique incidence type AF sensor, and the focus signal S1 from the photoreceiver 32 is monitored by the arithmetic unit 33.

Figure 4:
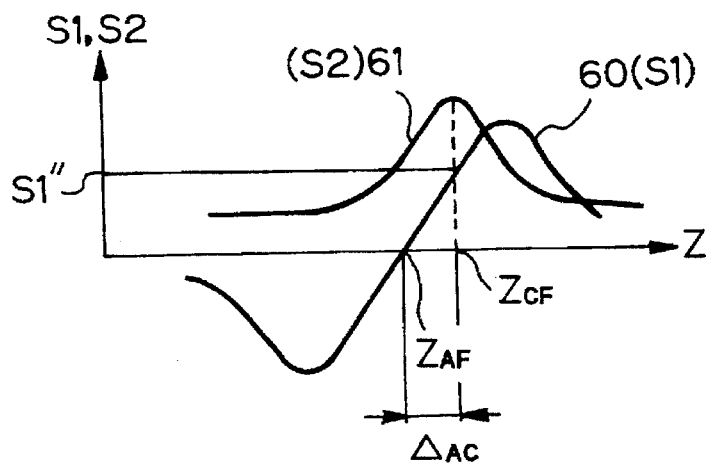
FIG. 4 is a waveform chart showing a focus signal (S1) and a detection signal (S2), which are obtained when a focus position is detected in parallel by an oblique incidence type AF sensor and a stage slit type focus position detecting system.

FIG. 4 shows the changes of the focus signal S1 and the detection signal S2 relative to the Z-coordinate when the reference pattern plate 23 is moved in the direction Z as described above. Referring to FIG. 4, the S-shaped curve 60 represents the focus signal S1. The Z-coordinate $Z_{AF}$ at which the focus signal S1 is zero is the focus position obtained by the oblique incidence type AF sensor. The cone-shaped curve 61 represents the detection signal S2. The Z-coordinate $Z_{CF}$ at which the detection signal S2 reaches a maximum value is the focus position obtained by the stage slit type focus position detecting system. The focus position $Z_{CF}$ is the accurate focus position of the projection optical system 13 that is obtained by using exposure light. In this case, the relationship between the amount of change of the focus signal S1 and the amount of change of the Z-coordinate in the linear portion of the focus signal S1 has previously been obtained, so that the arithmetic unit 33 can obtain a difference between the focus position $Z_{AF}$ and the focus position $Z_{CF}$.

It should be noted that, when the focus position is detected by the stage slit type focus position detecting system using, for example, the opening pattern unit 11B, which is closer to the outer periphery of the reticle 10 shown in FIG. 3(a), if one reference opening pattern 58 of the reference pattern plate 23 is used, the focus position in a meridional direction is detected, whereas, if the other reference opening pattern 59 is used, the focus position in a sagittal direction is detected.

There are cases where a reticle which is to be used for actual exposure process has an excessive space for an opening pattern unit, which is used to detect the focus position by the stage slit type focus position detecting system, according to the circuit pattern configuration. In such a case, the reticle may previously be formed with an opening pattern unit such as the opening pattern units 11A to 11C, thereby allowing the focus position to be detected by the stage slit type focus position detecting system.

As has been described above, the stage slit type focus position detecting system illuminates an opening pattern unit on the reticle 10 with exposure light IL1 from the illumination optical system used for actual exposure process. Accordingly, even when a modified light source illumination method, for example, is used, the focus position of the projection optical system 13 can be accurately obtained according to the illumination method employed. However, the stage slit type focus position detecting system requires the reticle to have been formed with a predetermined opening pattern unit. Therefore, there are cases where the focus position of the projection optical system 13 cannot be detected with a reticle which is to be used for actual exposure process. In addition, where the focus position can be measured is undesirably limited to a specific area in the exposure field.

In this regard, the oblique incidence type AF sensor shown in FIG. 1 is designed to detect the focus position at one point in the central portion, for example, of the exposure field. However, it enables an oblique incidence type multipoint AF sensor to be constructed, for example, by obliquely projecting a slit image onto each of a plurality of measuring points in the exposure field.

Figure 5:
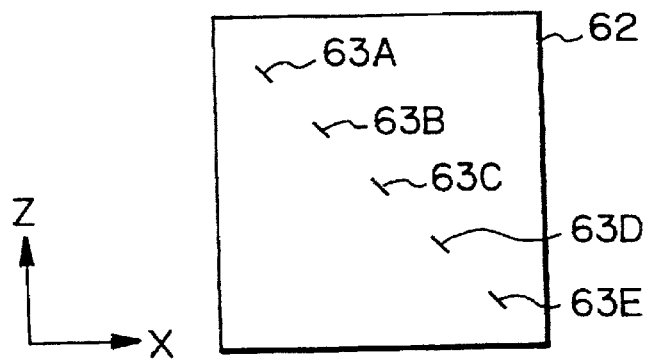
FIG. 5 is a plan view showing one example of the arrangement of measuring points in a case where an oblique incidence type multipoint AF sensor is used.

FIG. 5 shows one example of the arrangement of a plurality of measuring points in a case where an oblique incidence type multipoint AF sensor is used. Referring to FIG. 5, five measuring points 63A to 63E are diagonally set in the exposure field 62 of the projection optical system 13, and slit images are projected onto the measuring points 63A to 63E by illuminating light from the slit plate 26 (see FIG. 1). Reflected light rays from the measuring points 63A to 63E are converged to re-form slit images on the vibrating slit plate 31 (see FIG. 1). Thus, the focus position at each of the measuring points 63A to 63E is obtained on the basis of the position where the relevant slit image is re-formed and the position where the focus signal S1 becomes zero. However, if calibration of the focus position at each of the plurality of measuring points is made by using the stage slit type focus position detecting system, the reticle must have opening pattern units formed at positions conjugate to the plurality of measuring points. However, it is difficult to form such opening pattern units in a reticle used for actual exposure process. Accordingly, it is convenient to use a stage emission type focus position detecting system (described below) for ordinary calibration of the oblique incidence type AF sensor with respect to a plurality of measuring points.

Figure 6A:
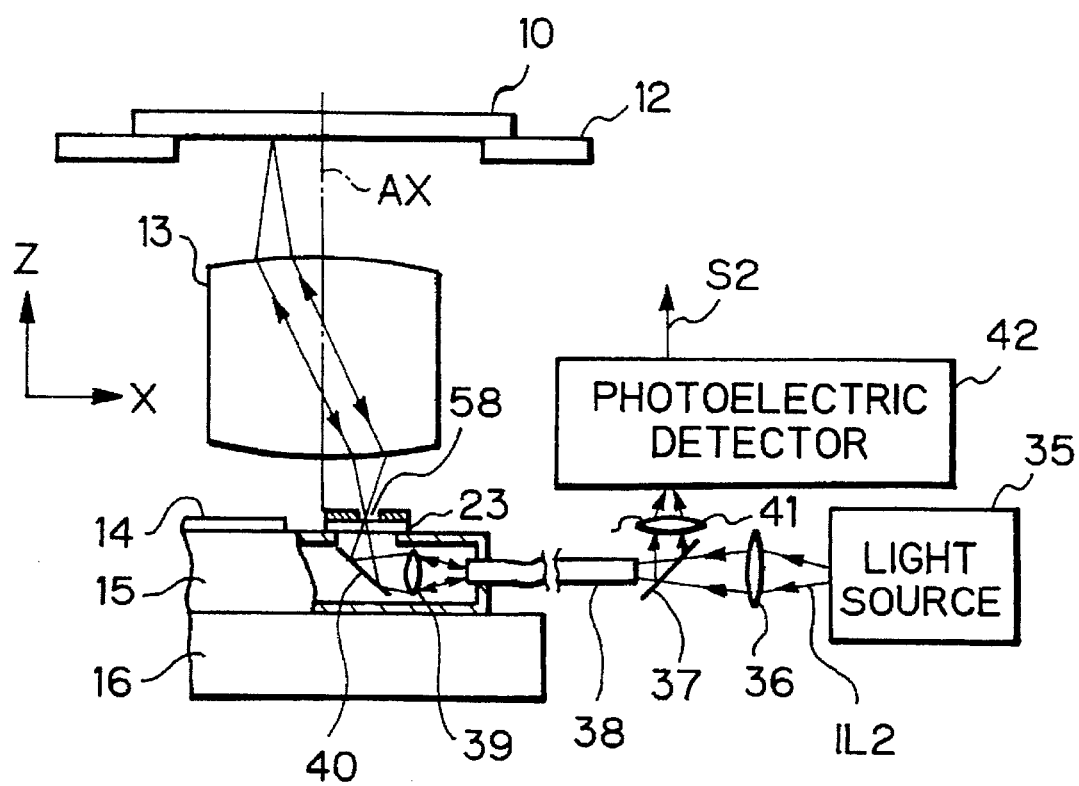
FIG. 6(a) is a fragmentary sectional view showing an arrangement employed when a focus position is obtained by a stage emission type focus position detecting system in FIG. 1.

FIG. 6(a) shows the arrangement of a stage emission type focus position detecting system in this embodiment. In FIG. 6(a), a light-transmitting system comprises a light source 35 for emitting illuminating light IL2 of the same wavelength as that of the exposure light IL1, a converging lens 36 for converging illuminating light from the light source 35 so that the light is led to one end of a light guide 38 through a half-mirror 37, a converging lens 39 for converging illuminating light emitted from the other end of the light guide 38, and a mirror 40 for leading the converged illuminating light to the bottom of the reference pattern plate 23. As the light source 35, for example, an optical system which transmits light branched off from the exposure light IL1 in the light source system 1 through a light guide is used.

As shown in FIG. 3(b), the reference pattern plate 23 is formed with reference opening patterns 58 and 59 which are different in directivity from each other. Therefore, in the arrangement shown in FIG. 1, illuminating light reflected from the mirror 40 is directed to irradiate either one of the reference opening patterns 58 and 59 through a shutter mechanism (not shown). By switching the reference opening patterns 58 and 59, it is possible to obtain focus positions in the meridional and sagittal directions independently of each other. In FIG. 6(a), one reference opening pattern 58 has been selected and set on a desired measuring point in the exposure field by driving the XY-stage 16, for the sake of description.

Illuminating light passing through the reference opening pattern 58 provided on the Z-stage 15 forms an image of the reference opening pattern 58 on the lower surface of the reticle 10 through the projection optical system 13. Reflected light from the lower surface of the reticle 10 returns to the reference opening pattern 58 through the projection optical system 13. Illuminating light returned through the reference opening pattern 58 enters the light-receiving system of the stage emission type focus position detecting system in which it travels via the mirror 40, the converging lens 39, the light guide 38, the beam splitter 37 and the converging lens 41 and is received by the photoelectric detector 42. The photoelectric detector 42 photoelectrically converts the incident light to obtain a detection signal S2, which is also supplied to the arithmetic unit 33. During the detection process, the reference pattern plate 23 is moved in the direction Z by driving the Z-stage 15. When the surface of the reference pattern plate 23 coincides with the image-formation plane as a result of the movement of the reference pattern plate 23, the detection signal S2 reaches a maximum. Thus, the focus position can be obtained. As a Z-coordinate measuring sensor for the focus position detection, the oblique incidence type AF sensor is also usable.

Figure 6B:
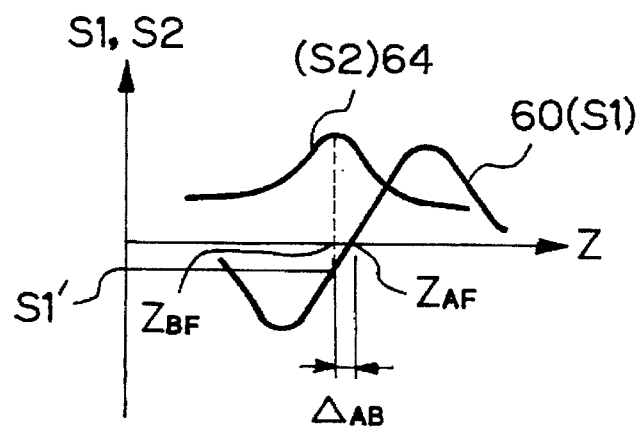
FIG. 6(b) is a waveform chart showing a focus signal (S1) and a detection signal (S2), which are obtained when a focus position is detected in parallel by the oblique incidence type AF sensor and the stage emission type focus position detecting system.

FIG. 6(b) shows the changes of the focus signal S1 from the oblique incidence type AF sensor and the detection signal S2 from the stage emission type focus position detecting system relative to the Z-coordinate when the reference pattern plate 23 is moved in the direction Z as described above. In FIG. 6(b), the curve 60 represents the focus signal S1, and the cone-shaped curve 64 represents the detection signal S2. The Z-coordinate $Z_{BF}$ at which the detection signal S2 reaches a maximum is the focus position obtained by the stage emission type focus position detecting system. In this case also, the arithmetic unit 33 can obtain a difference between the focus position $Z_{AF}$ and the focus position $Z_{BF}$.

Thus, the stage emission type focus position detecting system can directly detect the focus position of the projection optical system 13 at any measuring point in the exposure field through the projection optical system 13. However, the illumination system for illuminating the reference opening pattern 58 or 59 on the reference pattern plate 23 is different from the illumination optical system for actual exposure. Accordingly, the focus position obtained by the stage emission type focus position detecting system may deviate from the position of the image-formation plane of the projection optical system 13 in a case where the illumination optical system for actual exposure is used, due to a difference in the illuminance distribution at the pupil plane (Fourier transform plane) of the projection optical system 13. Therefore, it is necessary to take into account the result of detection by the stage slit type focus position detecting system in order to calibrate the focus position obtained by the oblique incidence type AF sensor even more accurately.

The arithmetic unit 33 calibrates the focus position detected by the oblique incidence type AF sensor using the detection signals S2 and S1, and supplies the corrected focus signal S1 to the control unit 20. The control unit 20 controls the focus position of the Z-stage 15 through the Zθ driving system 22 so that the focus signal S1 becomes zero. Thus, the surface of the wafer 14 is adjusted so as to be coincident with the image-formation plane of the projection optical system 13 by the auto-focusing method.

One example of an exposure operation of the projection optical system in this embodiment will be explained below with reference to the flowchart of FIG. 7. It is assumed that auto-focusing is effected on the basis of the result of measurement at one measuring point in the center of the exposure field, for example. First, at Step 101 in FIG. 7, the Z-coordinates $Z_{AF}$ and $Z_{BF}$ (see FIG. 6(b)) of focus positions are obtained by the oblique incidence type AF sensor and the stage emission type focus position detecting system, respectively. For this purpose, one reference opening pattern 58 (see FIG. 3(b)) of the reference pattern plate 23 is set in the center of the exposure field of the projection optical system 13 in the arrangement shown in FIG. 1, as has already been described above. Then, illuminating light is emitted from the light source 35. At the same time, the oblique incidence type AF sensor also projects a slit image from the slit plate 26 onto the reference opening pattern 58. Under these conditions, the reference pattern plate 23 is moved in the direction Z by driving the Z-stage 15, and thus a focus signal S1 and a detection signal S2 are taken in by the arithmetic unit 33.

Consequently, the curve 60 of the focus signal S1 and the curve 64 of the detection signal S2 are obtained as shown in FIG. 6(b). It should, however, be noted that at this time the abscissa axis in FIG. 6(b) represents time t. In this case, the Z-coordinate at which the curve 60 crosses the abscissa axis of signal intensity 0 is the focus position $Z_{AF}$ obtained by the oblique incidence type AF sensor, and the Z-coordinate obtained when the curve 64 reaches a maximum is the focus position $Z_{BF}$ obtained by the stage emission type focus position detecting system. At Step 101, however, not the Z-coordinate itself but a difference $\Delta_{AB}$ (=$Z_{BF}-Z_{AF}$) between the coordinates $Z_{BF}$ and $Z_{AF}$ is obtained on the basis of the focus signal S1. More specifically, the arithmetic unit 33 converts the level S1' of the focus signal S1 detected when the curve 64 reaches a maximum, into a difference $\Delta_{AB}$, by using the level S1' and the previously obtained linear relationship between the deviation in the direction Z and the change of the focus signal S1. The difference $\Delta_{AB}$ is stored in a first memory 34a provided in the memory unit 34.

Next, at Step 102, the Z-coordinates $Z_{AF}$ and $Z_{CF}$ (see FIG. 4) of focus positions are obtained by the oblique incidence type AF sensor and the stage slit type focus position detecting system, respectively. For this purpose, as shown in FIG. 1, a reticle 10 having the opening pattern unit 11A formed in the center thereof is placed as a reticle. Then, the reference opening pattern 58 (see FIG. 3(b)) of the reference pattern plate 23 is put in a position conjugate to the opening pattern 56 (see FIG. 3(a)) of the opening pattern unit 11A. Then, exposure light IL1 is supplied from the light source system 1 to the fly-eye lens 2 and the relay lens 5. At the same time, the oblique incidence type AF sensor projects a slit image onto the reference opening pattern 58. Under these conditions, the reference pattern plate 23 is moved in the direction Z by driving the Z-stage 15, thereby inputting a focus signal S1 and a detection signal S2 to the arithmetic unit 33.

As a result, the curve 60 of the focus signal S1 and the curve 61 of the detection signal S2 are obtained as shown in FIG. 4. It should, however, be noted that at this time the abscissa axis in FIG. 4 represents time t. In this case, the focus position obtained by the oblique incidence type AF sensor is $Z_{AF}$, and the Z-coordinate obtained when the curve 61 reaches a maximum is the focus position $Z_{CF}$ detected by the stage slit type focus position detecting system. At Step 102 also, not the Z-coordinate itself but a difference $\Delta_{AC}$ (=$Z_{CF}$-$Z_{AF}$) between the coordinates $Z_{CF}$ and $Z_{AF}$ is obtained on the basis of the focus signal S1. More specifically, the arithmetic unit 33 converts the level S1" of the focus signal S1 detected when the curve 61 reaches a maximum to a difference $\Delta_{AC}$, and stores it in a second memory 34b provided in the memory unit 34.

Next, at Step 103, the arithmetic unit 33 calculates a difference $\Delta_{BC}$ (=$Z_{CF}$-$Z_{BF}$) between the focus position $Z_{CF}$ obtained by the stage slit type focus position detecting system and the focus position $Z_{BF}$ obtained by the stage emission type focus position detecting system. For this purpose, the arithmetic unit 33 subtracts the difference $\Delta_{AC}$ stored in the second memory 34b from the difference $\Delta_{AB}$ stored in the first memory 34a. At Step 104, the difference $\Delta_{BC}$ is stored in the first memory 34a as an offset $\Delta_B$ of the focus position obtained by the stage emission type focus position detecting system.

A reticle for actual exposure process, which has a circuit pattern formed thereon, is placed on the reticle stage 12 in FIG. 1. Then, the process proceeds to Step 105 at which, if an influence such as thermal deformation caused by thermal energy of exposure light appears in the projection optical system 13, the Z-coordinates $Z_{AF}'$ and $Z_{BF}'$ Of focus positions are obtained by the oblique incidence type AF sensor and the stage emission type focus position detecting system, respectively, in the same way as at Step 101. In this case, however, a difference $\Delta_{AB}'$ (=$Z_{BF}'$-$Z_{AF}'$) between the focus positions is obtained. Thereafter, at Step 106, an offset $\Delta_A'$ is obtained as a difference between the focus position $Z_{AF}'$ obtained by the oblique incidence type AF sensor and the true focus position (that is, a quantity obtained by correcting the Z-coordinate $Z_{BF}'$ of the focus position, which is detected by the stage emission type focus position detecting system using a reticle for actual exposure process, by the difference $\Delta_{BC}$ between the focus positions obtained by the stage slit and stage emission type focus position detecting systems, respectively, using the reticle 10, i.e. $Z_{BF}'$+$\Delta_{BC}$), as follows: The arithmetic unit 33 reads out the offset $\Delta_B$ from the first memory 34a, and calculates $\Delta_A'$ from the following equation:

$$\begin{aligned}\Delta_A' &= (Z_{BF}' + \Delta_{BC}) - Z_{AF}' \quad (1)\\ &= \{Z_{BF}' + (Z_{CF} - Z_{BF})\} - Z_{AF}'\\ &= (Z_{CF} - Z_{BF}) + (Z_{BF}' - Z_{AF}')\\ &= \Delta_B + \Delta_{AB}'\end{aligned}$$

As will be understood from the above equation, when the position of the image-formation plane of the projection optical system 13 changes because, for example, of absorption of thermal energy of exposure light while exposure is being continuously carried out, the focus position $Z_{CF}$ obtained by the stage slit type focus position detecting system and the focus position $Z_{BF}$ obtained by the stage emission type focus position detecting system change individually. However, the offset $\Delta_B$ as a difference between the focus positions $Z_{BF}$ and $Z_{CF}$ can be regarded as constant. Thereafter, the arithmetic unit 33 rotates the plane-parallel plate 43 in FIG. 1 to move the focus position detected by the oblique incidence type AF sensor in the direction Z by an amount corresponding to the offset $\Delta_A'$.

Then, it is checked at Step 107 whether or not there is a wafer as an object of exposure. If YES, the process proceeds to Step 108 at which the wafer is placed on the Z-stage 15. Thereafter, at Step 109, auto-focusing is initiated in which the Z-stage 15 is driven so that the focus signal S1 outputted from the oblique incidence type AF sensor becomes zero. At Step 110, exposure is carried out so that a reticle pattern image is projected and transferred onto each shot region on the wafer. Thereafter, the process proceeds to Step 111 to judge whether or not it is necessary to calibrate the oblique incidence type AF sensor. If NO, the process returns to Step 107 to continue the exposure. If it is judged at Step 111 that the oblique incidence type AF sensor needs to calibrated, the process returns to Step 105 to make calibration. When it is judged at Step 107 that there is no wafer to be exposed any longer, the exposure process is terminated.

If the rotary plate 3 in the illumination optical system is rotated to switch the illumination method, for example, from an ordinary illumination method to a modified light source illumination method after the termination of the exposure process, the control process returns to Step 101 to make even more accurate calibration of the oblique incidence type AF sensor.

Thus, according to this embodiment, when illumination methods of the illumination optical system are switched from one to another, the focus position obtained by the oblique incidence type AF sensor is accurately calibrated by using the stage slit type focus position detecting system and the stage emission type focus position detecting system. Thereafter, if there is likelihood that the position of the image-formation plane of the projection optical system 13 will change because, for example, of thermal deformation caused by irradiation with exposure light, the focus position obtained by the oblique incidence type AF sensor is calibrated by using the stage emission type focus position detecting system. Accordingly, auto-focusing can be accurately carried out even when the position of the image-formation plane changes with time.

Figure 8A:
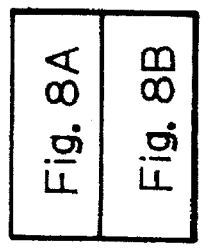
FIG. 8 is a flowchart showing another example of an operation in which exposure is carried out while the oblique incidence type AF sensor is being calibrated in the projection exposure apparatus shown in FIG. 1.
Figure 8B:
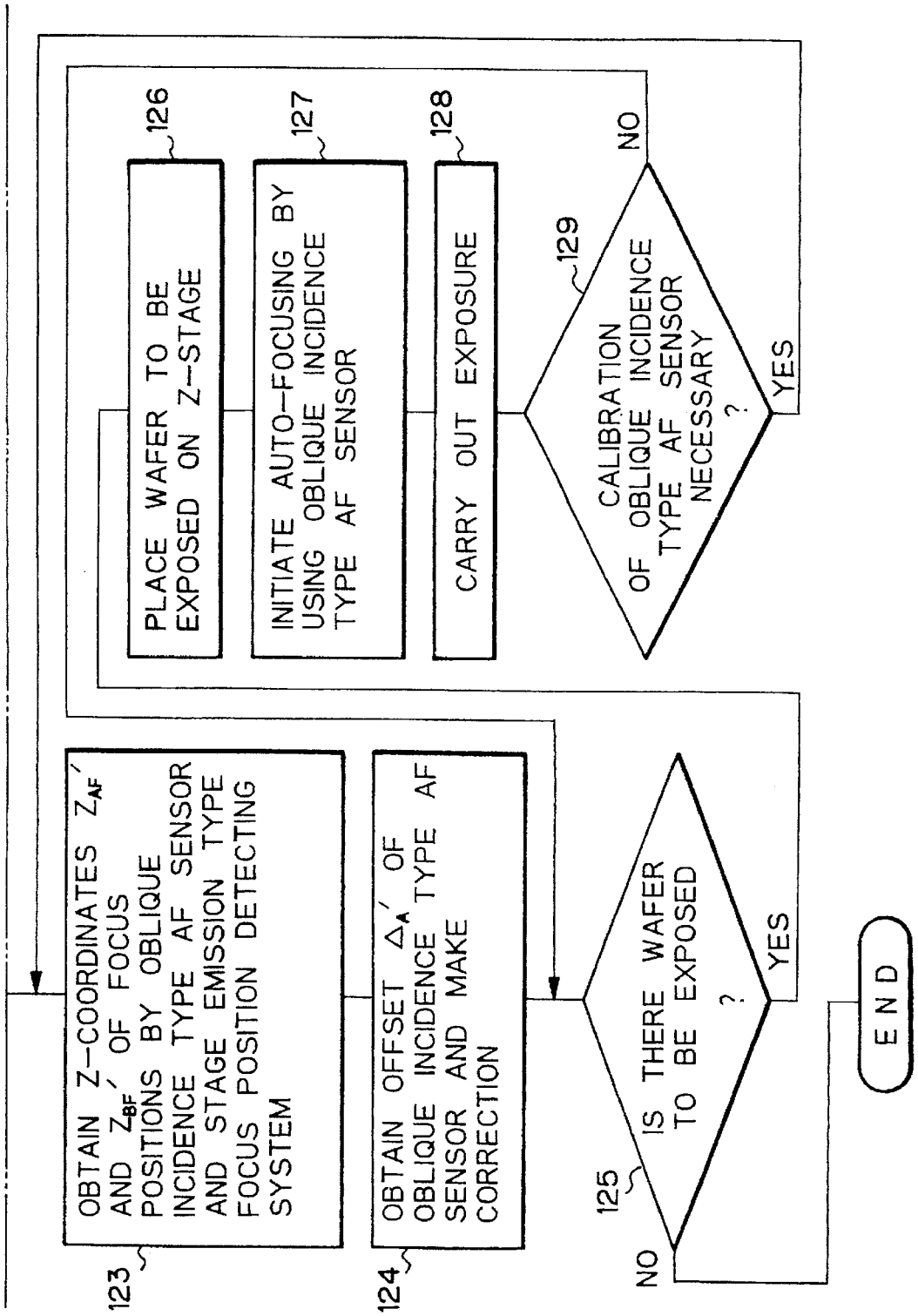

Next, another example of an exposure operation will be explained with reference to the flowchart of FIG. 8. First, at Step 121 in FIG. 8, the Z-coordinates $Z_{BF}$ and $Z_{CF}$ of focus positions are obtained by the stage emission type focus position detecting system and the stage slit type focus position detecting system, respectively. For this purpose, first, the emission of light from the light source system 1 in FIG. 1 is suspended, and illuminating light from the light source 35 is applied to the reference pattern plate 23. Under these conditions, the reference pattern plate 23 is moved in the direction Z, and the detection signal S2 is taken in by the arithmetic unit 33, thereby obtaining data that changes relative to the Z-coordinate as shown by the curve 64 in FIG. 6(b). The Z-coordinate $Z_{BF}$ of the peak of the curve 64 in this case is detected by a displacement sensor for the direction Z (not shown), e.g. a potentiometer, a laser interferometer, etc.

Thereafter, the emission of light from the light source 35 is suspended, and exposure light IL1 from the light source system 1 is applied to the reticle 10. Under these conditions, the reference pattern plate 23 is moved in the direction Z, and the detection signal S2 is taken in by the arithmetic unit 33, thereby obtaining data that changes relative to the Z-coordinate as shown by the curve 61 in FIG. 4. Then, the Z-coordinate $Z_{CF}$ of the focus position detected by the stage slit type focus position detecting system is obtained as the Z-coordinate obtained when the curve 61 reaches a peak. Next, at Step 122, a difference $\Delta_{BC}$ (=$Z_{CF}$-$Z_{BF}$) obtained by subtracting the Z-coordinate $Z_{BF}$ from the Z-coordinate $Z_{CF}$ is stored in the first memory 34a of the memory unit 34 as an offset $\Delta_B$ with respect to the focus position obtained by the stage emission type focus position detecting system. Thus, the offset $\Delta_B$ is obtained in the same way as at Step 104 in FIG. 7.

Figure 7B:
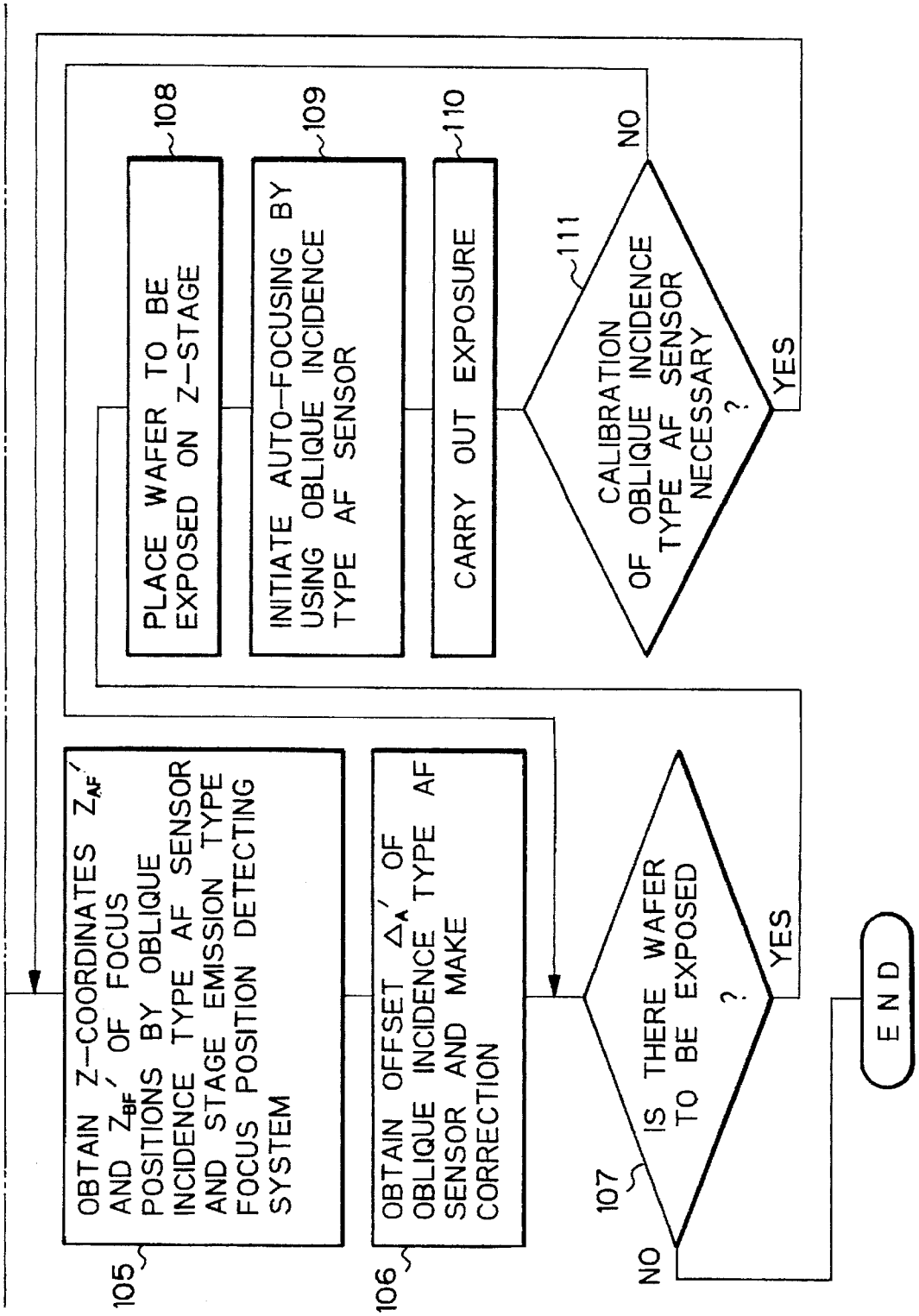
FIG. 7 is a flowchart showing one example of an operation in which exposure is carried out while the oblique incidence type AF sensor is being calibrated in the projection exposure apparatus shown in FIG. 1.

Thereafter, at Steps 123 to 129, exposure is carried out with respect to a wafer by an auto-focusing method while the focus position obtained by the oblique incidence type AF sensor is being calibrated in the same way as at Steps 105 to 111 in FIG. 7. According to the example shown in FIG. 8, the operation is simplified because a displacement sensor for the direction Z which is separate from the oblique incidence type AF sensor is used.

Although in the above-described embodiment the rotational angle of the plane-parallel plate 43 in FIG. 1 is adjusted by an amount corresponding to the offset $\Delta_{A'}$ of the oblique incidence type AF sensor, it will be clear that auto-focusing may be carried out such that the focus signal S1 reaches a level corresponding to the offset $\Delta_{A'}$, instead of making the above adjustment.

Although in the above-described embodiment the position in the direction Z is measured at one point in the exposure field, the arrangement may be such that the position in the direction Z is measured at each of five measuring points 63A to 63E, for example, in the exposure field as shown in FIG. 5 with the oblique incidence type AF sensor, and an average of the Z-direction positions measured at the five points is adjusted so as to be coincident with the image-formation plane of the projection optical system 13. One example of calibration made in this case is as follows: First, at one point in the exposure field, an offset $\Delta_B$ is obtained as a difference between the focus position $Z_{CF}$ obtained by the stage slit type focus position detecting system and the focus position $Z_{BF}$ obtained by the stage emission type focus position detecting system, and stored in the first memory 34a of the memory unit 34, as shown at Steps 101 to 104 in FIG. 7. The offset $\Delta_B$ is assumed to be constant throughout the exposure field 62.

Thereafter, at all the five measuring points 63A to 63E, offsets $\Delta_{AA}'$ to $\Delta_{AE}'$ of the results of detection by the oblique incidence type AF sensor are obtained from the offset $\Delta_B$ and the difference $\Delta_{AB}'$ (=$\Delta_A'$) between the focus position $Z_{BF}'$ obtained by the stage emission type focus position detecting system and the focus position $Z_{AF}'$ obtained by the oblique incidence type AF sensor, as shown at Steps 105 and 106 in FIG. 7. The offsets $\Delta_{AA}'$ to $\Delta_{AE}'$ are stored in the second memory 34b of the memory unit 34. When auto-focusing is to be effected thereafter, the coordinates $Z_{1A}$ to $Z_{1E}$ of Z-direction positions are obtained at the five measuring points 63A to 63E by the oblique incidence type AF sensor. Thereafter, the Z-coordinate of the Z-stage 15 is adjusted so that the square-sum of the differences between the coordinates $Z_{1A}$ to $Z_{1E}$ and the offsets $\Delta_{AA}'$ to $\Delta_{AE}'$, i.e. $\{=(Z_{1A}-\Delta_{AA}')^2+\ldots+(Z_{1E}-\Delta_{AE}')^2\}$, assumes a minimum value.

In this case, an offset $\Delta_A'$ of the result of detection by the oblique incidence type AF sensor may be obtained at one of the five measuring points (e.g. at 63C) by using the stage emission type focus position detecting system, and stored in the second memory 34b. Assuming that the offset $\Delta_A'$ is constant at the other measuring points, auto-focusing is effected, for example, by controlling the position of the Z-stage 15 so that the coordinates $Z_{1A}$ to $Z_{1E}$ of the Z-direction positions obtained by the oblique incidence type AF sensor at the five measuring points 63A to 63E are each equal to the offset $\Delta_A'$. By doing so, the oblique incidence type multipoint AF sensor is approximately and efficiently calibrated.

Although in FIG. 5 the measuring points 63A to 63E are arranged along a diagonal line in the exposure field 62, these measuring points may be two-dimensionally distributed in the exposure field 62. In this case, it is possible to calculate an inclination angle in addition to an average focus position of a plane in the exposure field by measurement of focus positions at a multiplicity of points. Therefore, auto-leveling can be effected by adjusting the inclination angle to the inclination angle of the image-formation plane.

Further, although in the above-described embodiment the oblique incidence type AF sensor is calibrated by taking into consideration the type of illumination method employed in the illumination optical system and thermal deformation of the projection optical system 13, it is preferable to further consider the presence of a photoresist coated on the wafer 14. That is, the wafer 14 is coated with a photoresist to a predetermined thickness (e.g. about 1 µm), and the position in the direction Z obtained by the oblique incidence type AF sensor is the position at the photoresist, for example, at the surface thereof. Therefore, even if auto-focusing is effected by using the oblique incidence type AF sensor, there is no guarantee that a resist image actually obtained by developing the photoresist will have the highest resolution.

Figure 9:
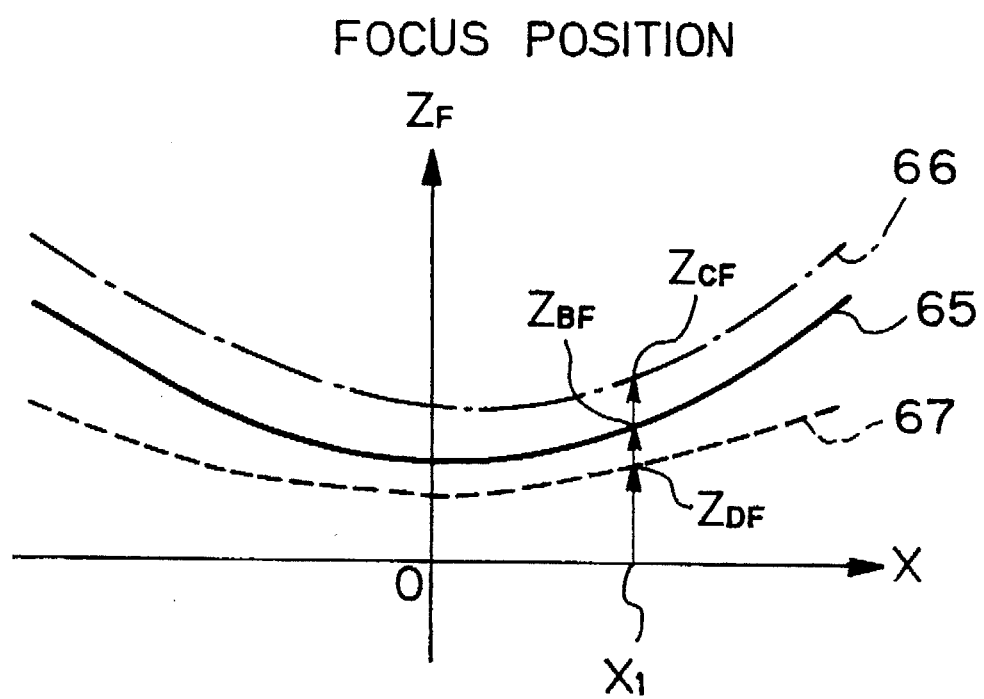
FIG. 9 is a graph showing one example of a difference between a focus position obtained on the basis of a resist image and a focus position obtained by each focus position detecting system in the embodiment.

FIG. 9 shows the relationship between the Z-coordinate $Z_F$ of the focus position obtained by each focus position detecting system and the Z-coordinate $Z_F$ at which the resist image is clearest (referred to as "the coordinate of the focus position based on the resist image"). In FIG. 9, the abscissa axis represents the X-coordinate of one cross-section in the exposure field, and the ordinate axis represents the Z-coordinate $Z_F$ of the focus position at the relevant X-coordinate. FIG. 9 shows an example in which displacement in the direction Z is detected by the oblique incidence type AF sensor with the coordinate of the focus position defined as 0, which was obtained by the oblique incidence type AF sensor before calibration.

In FIG. 9, the chain-line curve 66 represents the coordinate $Z_F$ of the focus position obtained by the stage slit type focus position detecting system, and the solid-line curve 65 represents the coordinate $Z_F$ of the focus position obtained by the stage emission type focus position detecting system (referred to as "coordinate of the focus position based on the spatial image"). Further, the dotted-line curve 67 represents the coordinate $Z_F$ of the focus position based on the resist image, which was obtained by repeating test printing with the Z-coordinate of the wafer being changed on the basis of the Z-coordinate measured with the oblique incidence type AF sensor. At the position $X_1$, for example, the coordinate $Z_{CF}$ of the focus position obtained by the stage slit type focus position detecting system and the coordinate $Z_{DF}$ of the focus position obtained on the basis of the resist image are different from each other.

Therefore, the arrangement may be such that, at one point in the exposure field, a difference $\Delta_{CD}$ (=$Z_{DF}-Z_{CF}$) between the coordinate $Z_{CF}$ of the focus position obtained by the stage slit type focus position detecting system and the coordinate $Z_{DF}$ obtained on the basis of the resist image has previously been obtained and stored in the memory unit 34 shown in FIG. 1, and that the difference $\Delta_{CD}$ is added when the offset $\Delta_B$ of the stage emission type focus position detecting system is to be obtained at Step 104 in FIG. 7. The difference $\Delta_{CD}$ may be individually corrected according to the position in the exposure field.

Further, in the above-described embodiment, a stage emission type focus position detecting system is used as a focus position detecting system having an illumination system independent of the illumination system for exposure of the projection exposure apparatus. In this case, the light-transmitting system of the independent illumination type focus position detecting system may use an illumination system in which a reference pattern plate is disposed between the projection optical system 13 and the reticle 10 in FIG. 10, and in which an image of a reference pattern formed on the reference pattern plate is projected on the lower surface of the reticle 10, and reflected light from the reticle 10 is led to the surface of the reference pattern plate 23 through the projection optical system 13.

Further, the stage slit type focus position detecting system used in the present invention is not necessarily limited to that shown in FIG. 1. For example, the stage slit type focus position detecting system may be arranged as follows: A reference reflecting surface is formed on the Z-stage 15 (or a part of the reference pattern plate 23 is formed as a reflecting surface), and a mark on the reticle 10 is illuminated by the illumination system for exposure. Light passing through the reticle 10 is passed through the projection optical system 13 and reflected by the reference reflecting surface, and light repassing through the projection optical system 13 and the reticle 10 is photoelectrically detected.

Further, the present invention is applicable not only to a stepper type projection exposure apparatus but also to a step-and-scan type projection exposure apparatus in which exposure is carried out with a reticle and a wafer being scanned relative to each other.

Thus, the present invention is not necessarily limited to the above-described embodiment, but may adopt various arrangements without departing from the gist of the present invention.

The projection exposure apparatus according to the present invention enables an oblique incidence type focus position detecting system (AF sensor) to be calibrated at any time by a focus position detecting system having an independent illumination system. Therefore, even when the position of the image-formation plane of the projection optical system has changed because, for example, of absorption of thermal energy of exposure light, a desired measuring point on a photosensitive substrate can be accurately adjusted to the position of the image-formation plane by an auto-focusing method. In this process, auto-focusing can be accurately effected according to the actual illumination condition by previously obtaining an offset of the independent illumination type focus position detecting system by using a stage slit type focus position detecting system.

Further, when illumination optical systems are switched from one to another in order to improve resolution, for example, an offset of the independent illumination type focus position detecting system is reobtained by using the stage slit type focus position detecting system, thereby enabling a desired measuring point on a photosensitive substrate to be accurately adjusted to the position of the image-formation plane by an auto-focusing method.

In a case where the light-receiving system of the independent illumination type focus position detecting system and the light-receiving system of the stage slit type focus position detecting system are arranged to be common to the two focus position detecting systems, the arrangement of the optical system is simplified.

According to another aspect of the present invention, the light-transmitting system of the independent illumination type focus position detecting system is arranged to illuminate an opening pattern on the substrate stage toward the projection optical system, and the light-receiving system of the independent illumination type focus position detecting system receives illuminating light that goes and returns through the projection optical system. In this case, the focus position detecting system is a so-called stage emission type focus position detecting system which enables the position of the image-formation plane to be rapidly detected through the projection optical system.

According to another aspect of the present invention, the projection exposure apparatus is provided with a first memory for storing a difference between a first focus position obtained by the independent illumination type focus position detecting system at at least one point in the exposure field of the projection optical system and a second focus position obtained by the stage slit type focus position detecting system at the at least one point, and an arithmetic unit for obtaining a reference image-formation position used to generate a focus signal in the oblique incidence type focus position detecting system by using the first focus position obtained by the independent illumination type focus position detecting system and the difference stored in the first memory. In this case, assuming that the difference is approximately constant throughout the exposure field, the oblique incidence type focus position detecting system can be efficiently calibrated.

According to another aspect of the present invention, the oblique incidence type focus position detecting system is a multipoint focus position detecting system, and the projection exposure apparatus is further provided with a second memory for storing a difference between the first focus position obtained by the independent illumination type focus position detecting system at at least one of a plurality of measuring points and a focus position obtained by the oblique incidence type focus position detecting system at the at least one of the measuring points, so that the arithmetic unit obtains a reference image-formation position used to generate a focus signal in the oblique incidence type focus position detecting system by using the differences stored in the first and second memories. In this case, assuming that the difference between the focus positions respectively detected by the oblique incidence type focus position detecting system and the independent illumination type focus position detecting system is approximately constant throughout the exposure field, the oblique incidence type focus position detecting system can be efficiently calibrated.

Further, the arrangement may be such that an offset of the independent illumination type focus position detecting system is obtained by the stage slit type focus position detecting system, and a difference between the focus position obtained by the stage slit type focus position detecting system and the focus position obtained by the oblique incidence type focus position detecting system on the basis of a resist image is added to the above offset, thereby obtaining a reference image-formation position for the oblique incidence type focus position detecting system. With this arrangement, it is possible to improve the resolution of the resist image actually obtained by developing the photoresist.

What is claimed is:

1. A projection exposure apparatus comprising:
   an illumination optical system for illuminating a mask with exposure light;
   a projection optical system for projecting an image of a pattern formed on said mask onto a photosensitive substrate under said exposure light;
   a substrate stage which is movable in a plane perpendicular to an optical axis of said projection optical system with said photosensitive substrate placed thereon, and which is also capable of moving said photosensitive substrate in said optical axis direction;
   an oblique incidence type focus position detecting system having a light-transmitting system for projecting a pattern image for focus detection onto said photosensitive substrate within an exposure field of said projection optical system obliquely to the optical axis of said projection optical system, and a light-receiving system which receives reflected light from said photosensitive substrate, re-forms said pattern image for focus detection, and generates a focus signal corresponding to an amount of deviation of a position where the pattern image is re-formed from a predetermined reference image-formation position, so that a position of said substrate in said optical axis direction is adjusted on the basis of said focus signal;

an independent illumination type focus position detecting system having a light-transmitting system for projecting an image of a predetermined measuring pattern onto said mask with independent illuminating light in the same wavelength region as said exposure light, and a light-receiving system which receives light from said pre-determined measuring pattern image through said projection optical system and an opening pattern provided on said substrate stage, and which generates a first focus detecting signal corresponding to a quantity of light received;

a stage slit type focus position detecting system which receives exposure light emanating from a predetermined pattern on said mask illuminated by said illumination optical system through said projection optical system and an opening pattern provided on said substrate stage, and which generates a second focus detecting signal corresponding to a quantity of light received; and a changing system for changing the reference image-formation position used to generate a focus signal in said oblique incidence type focus position detecting system, on the basis of a first focus position of said projection optical system which is obtained by said independent illumination type focus position detecting system and a second focus position of said projection optical system which is obtained by said stage slit type focus position detecting system.

2. A projection exposure apparatus according to claim 1, wherein the light-receiving system of said independent illumination type focus position detecting system and the light-receiving system of said stage slit type focus position detecting system are the same light receiving system that is common to said two focus position detecting systems.

3. A projection exposure apparatus according to claim 1, wherein the light-transmitting system of said independent illumination type focus position detecting system illuminates the opening pattern on said substrate stage toward said projection optical system, and the light-receiving system of said independent illumination type focus position detecting system receives illuminating light that goes and returns through said projection optical system.

4. A projection exposure apparatus according to claim 1, further comprising:

a first memory for storing a difference between said first focus position obtained by said independent illumination type focus position detecting system at at least one point in the exposure field of said projection optical system and said second focus position obtained by said stage slit type focus position detecting system at said at least one point; and arithmetic means for obtaining a reference image-formation position used to generate a focus signal in said oblique incidence type focus position detecting system, by using said first focus position obtained by said independent illumination type focus position detecting system and the difference stored in said first memory.

5. A projection exposure apparatus according to claim 4, wherein said oblique incidence type focus position detecting system is a multipoint focus position detecting system in which pattern images for focus detection are projected on a plurality of measuring points, respectively, in the exposure field of the projection optical system, and a focus position of said projection optical system at each of said measuring points is detected, said apparatus further comprising a second memory for storing a difference between said first focus position obtained by said independent illumination type focus position detecting system at at least one of said measuring points and a focus position obtained by said oblique incidence type focus position detecting system at said at least one of said measuring points, said arithmetic means obtaining a reference image-formation position used to generate a focus signal in said oblique incidence type focus position detecting system, by using the differences stored in said first and second memories.

6. A projection exposure apparatus comprising:

an illumination optical system for illuminating a mask with exposure light;

a projection optical system for projecting an image of a pattern formed on said mask onto a photosensitive substrate under said exposure light;

a substrate stage which is movable in a plane perpendicular to an optical axis of said projection optical system with said photosensitive substrate placed thereon, and which is also capable of moving said photosensitive substrate in said optical axis direction;

an oblique incidence type focus position detecting system having a light-transmitting system for projecting a pattern image for focus detection onto said photosensitive substrate within an exposure field of said projection optical system obliquely to the optical axis of said projection optical system, and a light-receiving system which receives reflected light from said photosensitive substrate, re-forms said pattern image for focus detection, and generates a focus signal corresponding to an amount of deviation of a position where the pattern image is re-formed from a predetermined reference image-formation position, so that a position of said substrate in said optical axis direction is adjusted on the basis of said focus signal;

an independent illumination type focus position detecting system having a light-transmitting system for projecting an image of a predetermined measuring pattern onto said mask with independent illuminating light in the same wavelength region as said exposure light, and a light-receiving system which receives light from said predetermined measuring pattern image through said projection optical system and an opening pattern provided on said substrate stage, and which generates a first focus detecting signal corresponding to a quantity of light received;

a stage slit type focus position detecting system which receives exposure light emanating from a predetermined pattern on said mask illuminated by said illumination optical system through said projection optical system and an opening pattern provided on said substrate stage, and which generates a second focus detecting signal corresponding to a quantity of light received; and a changing system for changing the reference image-formation position in said oblique incidence type focus position detecting system, on the basis of a first difference between a focus position of said projection optical system which is obtained by said stage slit type focus position detecting system and another focus position of said projection optical system which is obtained by said oblique incidence type focus position detecting system on the basis of an image of a resist provided on said photosensitive substrate, and a second difference between a focus position of said projection optical system which is obtained by said independent illumination type focus position detecting system and another focus position of said projection optical system which is obtained by said stage slit type focus position detecting system.

7. A projection exposure apparatus in which a mask is illuminated with exposure light from an illumination optical system to transfer a pattern formed on said mask onto a substrate through a projection optical system, said apparatus comprising:

a first detecting system which projects an image of a predetermined reference pattern onto said mask by light from an independent illumination system different from said illumination optical system, and receives reflected light from said mask through said projection optical system and an opening pattern provided on a stage on which said substrate is placed, thereby detecting a focus position of said projection optical system;

an adjusting system which projects a pattern image for focus detection onto a predetermined measuring point on a surface of said substrate obliquely to an optical axis of said projection optical system, receives light reflected from said measuring point to re-form said pattern image for focus detection, and adjusts a position of said substrate in a direction of the optical axis of said projection optical system on the basis of an amount of deviation of a position where said pattern image is re-formed from a predetermined reference image-formation position; and a changing system for changing said reference image-formation position in said adjusting system on the basis of an amount of deviation of the focus position of said projection optical system detected by said first detecting system from a focus position of said projection optical system determined under exposure light from said illumination optical system.

8. A projection exposure apparatus according to claim 7, further comprising:

a second detecting system which receives an image of an opening pattern formed on a reference mask different from said mask, which is illuminated with exposure light from said illumination optical system, through said projection optical system and an opening pattern provided on said stage, thereby detecting a focus position of said projection optical system under exposure light from said illumination optical system.

9. A projection exposure apparatus according to claim 8, further comprising:

a first memory for storing an amount of deviation between the focus position detected by said first detecting system and the focus position detected by said second detecting system.

10. A projection exposure apparatus according to claim 9, wherein said changing system changes said reference image-formation position on the basis of the focus position detected by said first detecting system and the amount of deviation stored in said first memory.

11. A projection exposure apparatus according to claim 7, further comprising:

a second memory for storing a position adjustment error of said adjusting system caused by a resist coated on the surface of said substrate, said changing system changing said reference image-formation position by an amount corresponding to the position adjustment error stored in said second memory.

12. A projection exposure apparatus in which a mask is illuminated with exposure light from an illumination optical system to transfer a pattern formed on said mask onto a substrate through a projection optical system, said apparatus comprising:

a first detecting system which projects an image of a predetermined reference pattern onto said mask by light from an independent illumination system different from said illumination optical system, and receives reflected light from said mask through said projection optical system, thereby detecting a focus position of said projection optical system;

an adjusting system which applies a light beam to a surface of said substrate and receives reflected light from said substrate to adjust a position of said substrate in a direction perpendicular to an image formation of said projection optical system; and a memory for storing an amount of deviation of the focus position of said projection optical system detected by said first detecting system from a focus position of said projection optical system determined under exposure light from said illumination optical system as an offset information used when the position of said substrate is adjusted by said adjusting system.

13. A projection exposure apparatus according to claim 12, further comprising:

a second detecting system which receives an image of a reference pattern formed on another mask different from said mask, which is illuminated with exposure light from said illumination optical system, through said projection optical system and a stage reference pattern provided on a stage on which said substrate is placed, thereby detecting a focus position of said projection optical system under exposure light from said illumination optical system.

14. A projection exposure apparatus according to claim 12, further comprising:

a second detecting system which receives an image of a reference pattern formed on said mask, which is illuminated with exposure light from said illumination optical system, through said projection optical system and a stage reference pattern provided on a stage on which said substrate is placed, thereby detecting a focus position of said projection optical system under exposure light from said illumination optical system.

15. A projection exposure apparatus according to claim 12, wherein the offset information stored in said memory includes a position adjustment error of said adjusting system caused by a resist coated on the surface of said substrate.

16. A projection exposure method in which a mask is illuminated with exposure light from an illumination optical system to transfer a pattern formed on said mask onto a substrate through a projection optical system, said method comprising the steps of:

providing a detecting system which receives an image of a reference pattern illuminated with light from an independent illumination system different from said illumination optical system through said projection optical system, thereby detecting a focus position of said projection optical system;

providing an adjusting system which applies a light beam to a surface of said substrate and receives reflected light from said substrate to adjust a position of said substrate in a direction perpendicular to an image formation plane of said projection optical system;

detecting a focus position of said projection optical system by said detecting system; and moving the position of said substrate by said adjusting system using an amount of deviation of the focus position of said projection optical system detected by said detecting system from a focus position of said projection optical system determined under exposure light from said illumination optical system as an offset information.

17. A projection exposure method according to claim 16, further comprising the step of:

receiving an image of a reference pattern illuminated with exposure light from said illumination optical system through said projection optical system, thereby detecting a focus position of said projection optical system under said exposure light.

18. A projection exposure method according to claim 16, wherein said offset information includes a position adjustment error of said adjusting system caused by a resist coated on the surface of said substrate.

19. A projection exposure method according to claim 16, wherein said adjusting system applies a light beam to each of a plurality of points on the surface of said substrate and receives reflected light from each of said points.

20. A projection exposure method in which a mask is illuminated with exposure light from an illumination optical system to transfer a pattern formed on said mask onto a substrate through a projection optical system, said method comprising the steps of:

providing a detecting system which receives an image of reference pattern illuminated with light from an independent illumination system different from said illumination optical system through said projection optical system to detect a focus position of said projection optical system;

providing an adjusting system which applies a light beam to each of a plurality of points on a surface of said substrate and receives reflected light from each of said points to detect a position of said substrate surface in a direction of an optical axis of said projection optical system at each of said points, and which adjusts a position of said substrate on the basis of a result of said detection;

detecting a focus position of said projection optical system by said detecting system at each of a plurality of points corresponding to the points irradiated with light beams by said adjusting system; and moving the position of said substrate by said adjusting system using an amount of deviation of the focus position of said projection optical system detected by said detecting system from a focus position of said projection optical system determined under exposure light from said illumination optical system as an offset information.

* * * * *